United States Patent [19]

Ravid

[11] Patent Number: 5,031,074
[45] Date of Patent: Jul. 9, 1991

[54] CIRCUIT BOARD GUIDE AND INTERFITTING DEVICE TO ELIMINATE FLOATING CABLES

[76] Inventor: Gonen Ravid, 29034 Acanthus Ct., Agoura Hills, Calif. 91301

[21] Appl. No.: 535,720

[22] Filed: Jun. 11, 1990

[51] Int. Cl.$^5$ ............... H01R 23/68; H05K 7/02; G01R 31/00
[52] U.S. Cl. .................. 361/413; 361/393; 324/158 F; 324/212; 211/41
[58] Field of Search .............. 211/41; 324/158 F, 210, 324/212; 361/399, 412, 413, 415, 393

[56] References Cited

U.S. PATENT DOCUMENTS

| | | | |
|---|---|---|---|
| 3,953,797 | 4/1976 | Berard | 324/158 F |
| 4,335,819 | 6/1982 | Weisman et al. | 211/41 |
| 4,468,616 | 8/1984 | Yoshizaki | 324/158 F |
| 4,476,433 | 10/1984 | Logan | 324/158 P |
| 4,573,756 | 3/1986 | Smith | 324/158 F X |
| 4,658,212 | 4/1987 | Ozawa et al. | 324/158 F |
| 4,669,616 | 6/1987 | Mazura | 211/41 |
| 4,755,747 | 7/1988 | Sato | 324/158 F |
| 4,840,570 | 6/1989 | Mann, Jr. et al. | 361/413 X |
| 4,888,549 | 12/1989 | Wilson et al. | 324/158 F |
| 4,964,810 | 10/1990 | Malotke et al. | 361/415 |

OTHER PUBLICATIONS

IBM Technical Disclosure Bulletin, vol. 15, No. 5, Oct. 1972, R. J. Flaherty and R. O. Norton.

Primary Examiner—Leo P. Picard
Assistant Examiner—Michael W. Phillips
Attorney, Agent, or Firm—Thomas I. Rozsa

[57] ABSTRACT

A circuit board guide and interfitting device to eliminate floating cables. The device involves a mounting system for removably mounting the test printed circuit board or a multiplicity of such boards in a manner by which the test printed circuit boards can be plugged into an interface printed circuit board which in turn is plugged into the computer peripheral equipment to be tested such as disk drives, tape drives, floppy drives, optical drives, etc. The invention further involves a system wherein the specialized mounting member for removably mounting the test printed circuit board is combined with an interface board and a bracket for retaining an edge connector which in turn enables the test printed circuit board to be directly plugged into the interface printed circuit board which in turn can be directly plugged into the piece of equipment to be tested, all through the elimination of flexible interconnecting cables.

7 Claims, 2 Drawing Sheets

CIRCUIT BOARD GUIDE AND INTERFITTING DEVICE TO ELIMINATE FLOATING CABLES

BACKGROUND OF THE INVENTION

1. Field of the Invention

The present invention relates to improvements in testing computer circuit boards and testing various computer peripheral equipment such as tape drives, disk drives, floppy drives, optical drives, etc. In particular, the present invention relates to apparatus which eliminate the necessity of plugging and unplugging floating cables from the circuit board and provide an efficient and effective system for coupling and uncoupling test printed circuit boards and associated equipment which are being tested.

2. Description of the Prior Art

When testing and preparing printed circuit boards and also computer peripheral equipment, it is necessary to plug the disk drive and other equipment being tested into a test system. The conventional apparatus by which the printed circuit board from the test system is plugged into interfacing printed circuit boards is through flexible cables which have accommodating mating female plugs at both ends which are fit into accommodating male fingers on the printed circuit boards. While the flexible cable provides a flexible connector assembly to accommodate various locations of pins on printed circuit boards and male prongs on disk drives, it also presents several problems. First, when testing a lot of disk drives, the constant motion of plugging and unplugging the flexible cable into one drive after another creates a substantial possibility of damaging the cables or the mating prongs or pins on the disk drives. In addition, a second problem is the likelihood that the cable will be plugged in backwards, causing faulty readings and possible power shortages. Plugging in the cable backwards may also damage the disk drive or the computer printed circuit board.

In addition, most printed test circuit boards are conventionally held in a fixed or screwed down manner on a surface. In order to replace the test boards, it is necessary to unscrew the boards and then rescrew new test boards. This is time consuming process.

Therefore, there is a significant need for a mounting means by which the test printed circuit boards can be easily retained on the mounting board and removed and replaced with other boards and also a means for rapidly and efficiently plugging and unplugging the test printed circuit board into another printed circuit board to be tested, and to interface boards which are plugged into computer equipment to be tested.

SUMMARY OF THE PRESENT INVENTION

The present invention is a circuit board guide and interfitting device to eliminate floating cables. The present invention involves a novel mounting system for removably mounting the test printed circuit board or a multiplicity of such boards in a manner by which the test printed circuit boards can be plugged into an interface printed circuit board which in turn is plugged into the computer peripheral equipment to be tested such as disk drives, tape drives, floppy drives, optical drives, etc. . The present invention further involves a novel system wherein the specialized mounting means for removably mounting the test printed circuit board' is combined with an interface board and a bracket for retaining an edge connector which in turn enables the test printed circuit board to be directly plugged into directly plugged into the piece of equipment to be tested, all through the elimination of flexible interconnecting cables.

It has been discovered, according to the present invention, that if a multiplicity of spaced apart blocks are affixed to the test board table with each of the blocks comprising a pair of spaced apart longitudinal channels whose width is slightly greater than the width of the test printed circuit board, that the test printed circuit board can be removably retained in parallel grooves between a pair of adjacent blocks which are spaced apart such that the distance between the interior of the grooves is equal to or slightly greater than the length of the test printed circuit board.

It has further been discovered, according to the present invention, that if a fixed stop means such as a pin is located at the same position on adjacent blocks, then the test printed circuit board can be efficiently aligned within respective grooves of each block to be perfectly aligned to be interconnected with an interface circuit board.

It has additionally been discovered, according to the present invention, that if a removable stop means such as a pin is positioned at a location remote form the fixed pin means at a distance sufficient to permit the width of the test printed circuit board to be positioned between the two stop means, then the test printed circuit board can be retained in a manner which assures a proper alignment with an adjoining interface board and at the same time provides a means by which the test printed circuit board can be easily removed from the block and a new or different test printed circuit board replaced within the block for subsequent testing.

It has further been discovered that if the test printed circuit board is retained in the manner discussed and connected to an interface board which in turn retains an edge connector in a position to accommodate the male prongs of a piece of computer peripheral equipment to be tested such as a disk drive, then the entire system can be utilized to test a multiplicity of computer peripheral equipment in an efficient manner by which the test printed circuit board is plugged into the interface printed circuit board which in turn is plugged into the piece of computer peripheral equipment, all with the elimination of flexible cables and therefore making the operation much more accurate, much more efficient, and substantially reducing the likelihood of a problem with wrong connections or damaged cables.

It is therefore an object of the present invention to provide an efficient mounting means for removably retaining a test printed circuit board on a mounting board in a manner which enables the test printed circuit board to be very efficiently plugged into an interface printed circuit board without the use of flexible cables and further retains the test printed circuit board in a manner by which it can be efficiently removed and replaced with another printed circuit board.

It is another object of the present invention to provide a system wherein the test printed circuit board can be efficiently retained and further plugged into an interface printed circuit board which in turn is plugged into a piece of computer peripheral equipment to be tested, all with the elimination of flexible cables.

Further novel features and other objects of the present invention will become apparent from the following detailed description, discussion and the appended claims, taken in conjunction with drawings.

BRIEF DESCRIPTION OF THE DRAWINGS

Referring particularly to the drawings for the purpose of illustration only and not limitation, there is illustrated.

DETAILED DESCRIPTION OF THE PREFERRED EMBODIMENT

Although specific embodiments of the invention will now be described with reference to the drawings, it should be understood that such embodiments are by way of example only and merely illustrative of but a small number of the many possible specific embodiments which can represent applications of the principles of the invention. Various changes and modifications obvious to one skilled in the art to which the invention pertains are deemed to be within the spirit, scope and contemplation of the invention as further defined in the appended claims.

Figure 1:
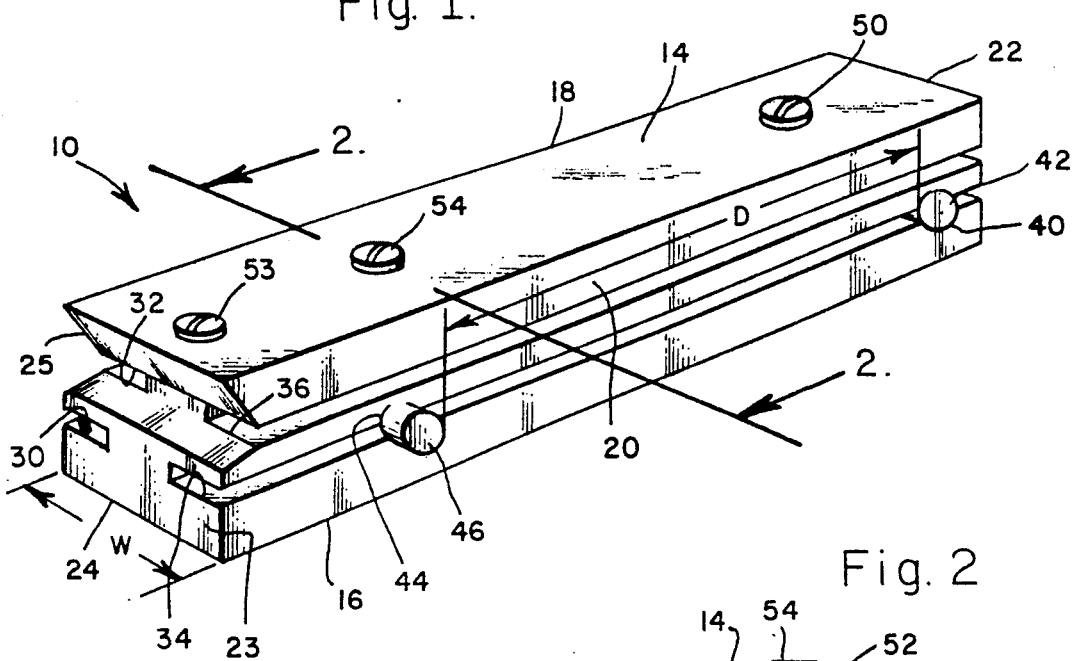
FIG. 1 is a perspective view of the present invention block member which acts as a circuit board guide.
Figure 2:
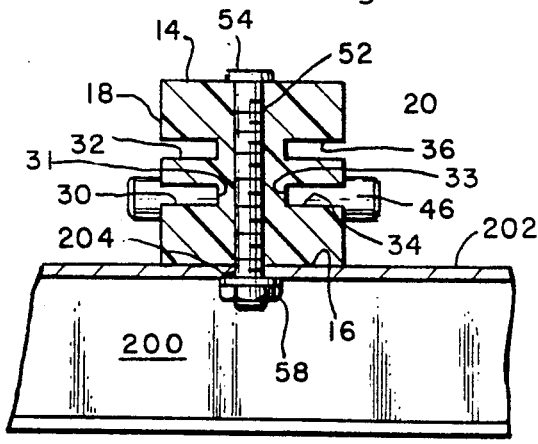
FIG. 2 is a cross-sectional view taken along line 2—2 of FIG. 1.

Referring particularly to FIGS. 1 and 2, there is illustrated at 10 the present invention block member which acts as a circuit board guide. In the preferred embodiment, the body 12 of block member 10 is generally rectangular in configuration and comprises a top 14, a bottom 16, a first sidewall 18, a second sidewall 20, a rear 22 and a front 24. Each sidewall contains a pair of spaced apart channels which extend into the body 12 of block member 10 and run for the entire length of the block member 10 exiting at the rear 22 and the front 24. Specifically, first sidewall 18 contains lower channel 30 and upper channel 32. Second sidewall 20 contains lower channel 34 and upper channel 36. Each channel extends for a given distance into the body 12 of block member 10. Block member 10 further comprises a pair of transverse generally cylindrical openings 40 and 44 which extend through the entire width of the body 12. Transverse opening 40 is adjacent rear 22 while transverse opening 44 is set at a distance "D" forward of transverse opening 40. A fixed stop means such as pin 42 extends through transverse opening 40 and runs for the entire width "W" of body 12. A movable stop means such as pin 46 extends through transverse opening 44. Pin 46 can be moved in and out of transverse opening 44. Rear 22 is generally perpendicular to top 14 and bottom 16. Front 24 is divided into two sections, a lower section 23 and an upper section 25. Lower section 23 which includes the opening of lower channels 30 and 34 is generally perpendicular to bottom 16. Upper section 25 is generally "V" shaped and is slanted inwardly toward body 12 so as to provide a guide into upper channels 32 and 36.

Referring to FIGS. 1 and 2, block member 10 is attached to a test board through attaching means which by way of example as illustrated are three bolts 50 and 54 which extend through vertical openings in the body 12. One of the vertical openings 52 through which bolt 54 extends is illustrated in FIG. 2. It will be appreciated that a comparable transverse opening exists at a more rearward location through which bolt 50 extends and another transverse opening exists adjacent the front 24 through which bolt 53 extends. The block member 10 is positioned on mounting board 200 such that bottom 16 rests against the upper surface 202 of mounting board 200 and the test board further comprises accommodating openings such as 204 to accommodate bolt 54 which is then fastened by nut 58. Bolts 53 and 50 are each attached in a similar manner. Alternatively, the test board 200 may comprise threads in the openings in its top 202 and the bolts 50, 53 and 54 may be threaded into the respective openings and be thereby retained.

The block member 10 may be made out of any suitable material such as plastic.

Figure 3:
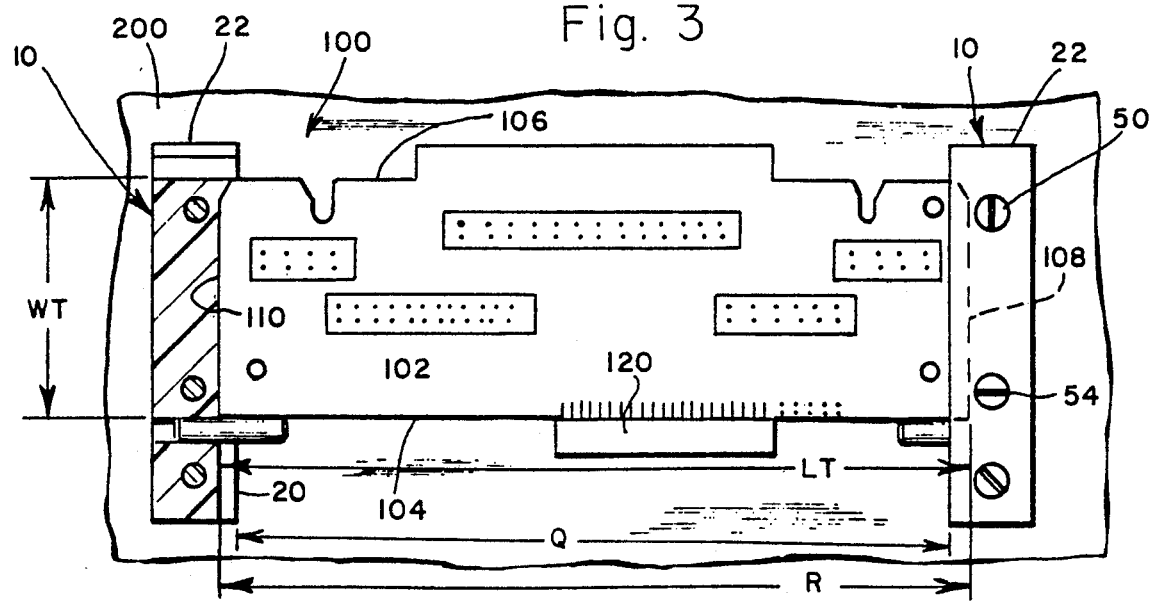
FIG. 3 is a top plan view in partial cross-section of a pair of block members acting as a circuit board guide and a circuit board retained therein which as a unit functions as circuit board guide and interfitting device to eliminate floating cables.

The method by which the test printed circuit board is retained by the present invention block member 10 is illustrated in FIG. 3. A test printed circuit board 100 is generally rectangular in configuration and comprises a top surface 102, a front lengthwise edge 104, a rear lengthwise edge 106, a first side edge 108, and a second side edge 110. The length of the test circuit board is "LT" and the width of the test circuit board is "WT". A pair of block members 10 are affixed to the mounting board 200 in the manner just described and are spaced apart such that the distance "Q" from the second sidewall 20 of one block member 10 to the first sidewall 18 of the second block member 10 is less than the length "LT" of test printed circuit board 100 and the distance "R" from the interior edge 33 of the lower channel 34 in second sidewall 20 of one block member to the interior edge 31 of the lower channel 30 in first sidewall 18 is greater than the length "LT" of test printed circuit board 100. Therefore, the test printed circuit board 100 can be slid into a pair of parallel oppositely disposed lower channels in adjacent and spaced apart block members 10 as illustrated in FIG. 3. In operation, the movable stop means such as pin 46 from each block member 10 is removed or at least slid so that a clear path along corresponding lower channels is defined from the front 24 to fixed stop means 42 in each block member 10. The test printed circuit board 100 is then slid into the corresponding lower channels 30 and 34. The distance "D" between the fixed stop means 42 and the movable stop means 46 is slightly greater than the width "WT" of the test printed circuit board 100. Therefore, after the test printed circuit board 100 is slid into the two lower channels 30 and 34 of the two spaced apart block members 10, the movable stop means 46 are slid back across their respective lower channels 30 and 34 to thereby block the test printed circuit board 100 from being slid out of the channels. In this manner the test printed circuit board can be aligned as desired in an efficient manner and at the same time be firmly held in place in a removable manner.

Figure 4:
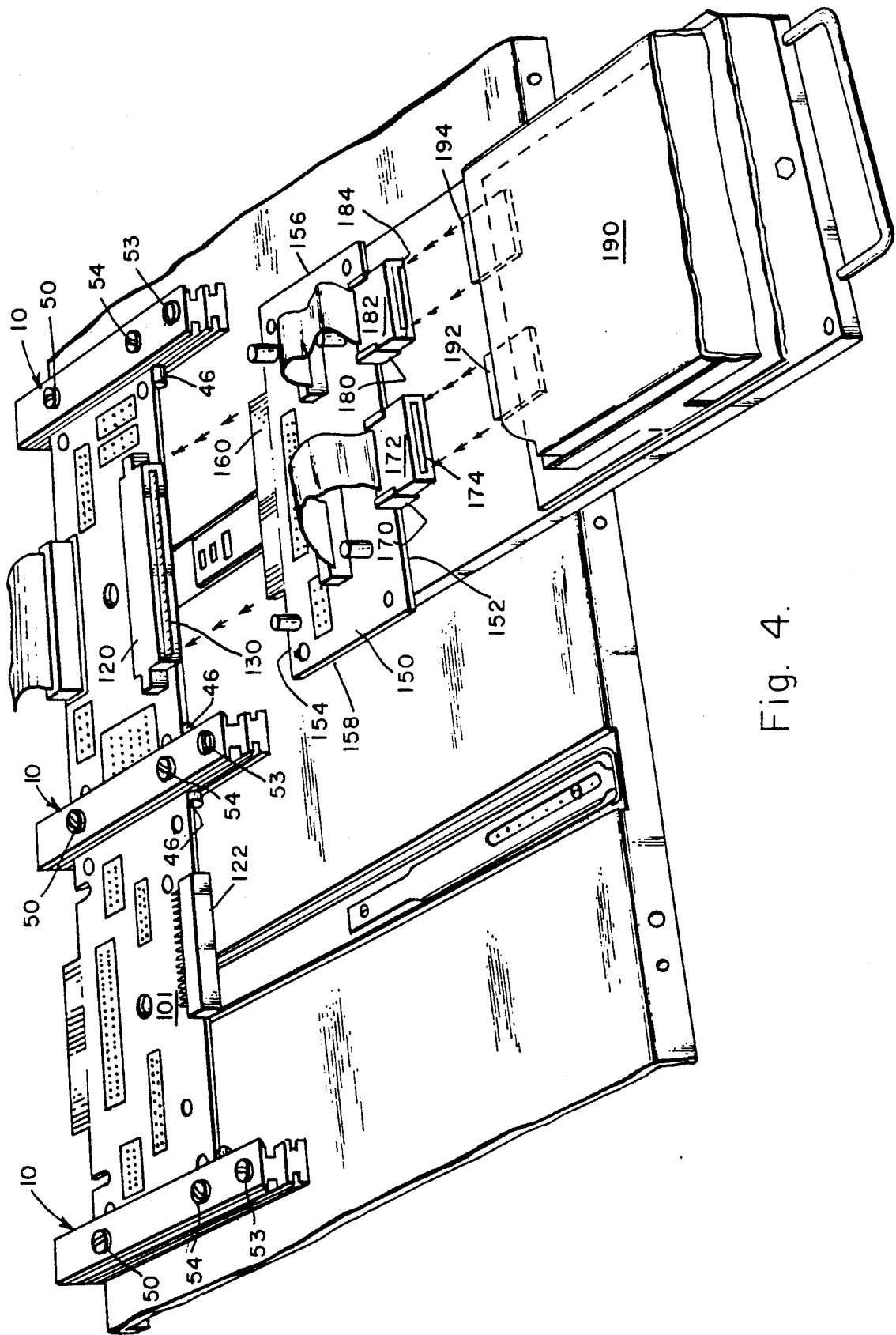
FIG. 4 is a top plan view of the system of the present invention including a pair of block members acting as a circuit board guide and a test circuit board retained therein which as a unit functions as a circuit board guide and interfitting device to eliminate floating cables, plus an interface circuit board connected to a test circuit board and a computer disk drive to be tested connected to the interface board.

Referring to FIGS. 3 and 4, it can be seen that the test printed circuit board 100 further comprises a fixed connecting member 120 comprises a multiplicity of female connecting members 130. A key feature of the present invention is that the female connecting members 130 are aligned in the same vertical plane as the upper channels 32 and 36 in the two block members 10 which support the test printed circuit board 100.

Referring to FIG. 4, an interface printed circuit board 150 comprises a front lengthwise edge 152, a rear lengthwise edge 154, a first side edge 156, and a second side edge 158. Along rear lengthwise edge 154 interface printed circuit board 150 further comprises male mating prongs 160 which are designed to be accommodated into female connector members 130. The significance of the fact that the female connector members 130 must be aligned with the upper channels 32 and 36 will now be appreciated. The lengthwise dimension of the interface printed circuit board 150 is approximately the same as the lengthwise dimension "LT" of the test printed circuit board 100. It is within the spirit and scope of the present invention for the length of the interface printed circuit board to be longer than the test printed circuit board 100 in which case the respective upper channels 32 and 36 will have to be deeper than the lower channels 20 and 34, however, in the preferred embodiment the channels 30, 34, 32 and 36 all extend for the approximately the same amount of depth into the body 12 and therefore in the preferred embodiment the length of interface printed circuit board 150 is approximately equal to the length of test printed circuit board 100. Therefore, interface printed circuit board 150 is slid into corresponding upper channels 32 and 36 as illustrated in FIG. 4 and thereby the male prongs 160 are accommodated into female connector members 130. The V-shaped upper portion 25 of front 24 serves as a guide to assist the interface printed circuit board 150 to easily slide into upper grooves 32 and 26. A second type of female connector 122 is illustrated in FIG. 4 and is positioned on adjacent test circuit board 101. The operation is the same as just described.

The front lengthwise edge 152 of interface printed circuit board 150 further comprises a pair of spaced apart frame members 170 and 180 respectively. Each frame member retains an edge connector 172 and 182 respectively. Edge connector 172 comprises female connector members 174. Edge connector member 182 comprises female connector members 184. Each respective edge connector is most commonly a standard edge connector comprising either 50, 34, or 20 female connector members. The edge connectors 172 and 182 are spaced apart by the required distance to accommodate the male mating prongs of a computer peripheral device to be tested, which device is illustrated as 190. The device to be tested may be a computer disk drive, tape drive, floppy drive, optical drive, etc.. The male prongs 192 and 194 are accommodated within respective female connector members 174 and 184 in edge connectors 172 and 182 respectively.

To assist in the sliding movement, the interface printed circuit board 150 and the test device 190 may be positioned on a sliding tray 198 which can slide relative to the fixed test printed circuit board 100. This is not a requirement but merely facilitates the operation of the entire system.

Remaining conventional portions of a test printed circuit board and an interface printed circuit board are also illustrated in FIG. 4.

In addition, the present invention is designed to be able to simultaneously test a multiplicity of devices on adjacent assemblies. In FIG. 4, two adjacent test printed circuit boards 100 and 101 are shown supported by three block members 10 It will be appreciated that any multiplicity of block members can be utilized to support a multiplicity of adjacent test printed circuit boards which in turn accommodate interface printed circuit boards which in turn accommodate devices to be tested. Therefore, the devices can be aligned in a row and tested one after the other or simultaneously tested through the present invention.

Therefore, through use of the present invention, a full system can be prepared in which a pair of block members 10 acting as a circuit board guide retain a test circuit board 100 in parallel corresponding lower channels 30 and 34 and further acts as a unit with its connector member 120 accommodate the male mating prongs 160 of interface circuit board 150 which in turn comprises a pair of edge connectors 172 and 182 which accommodate the prongs of the device to be tested 190.

Of course the present invention is not intended to be restricted to any particular form or arrangement, or any specific embodiment disclosed herein, or any specific use, since the same may be modified in various particulars or relations without departing from the spirit or scope of the claimed invention hereinabove shown and described of which the apparatus is intended only for illustration and for disclosure of an operative embodiment and not to show all of the various forms of modification in which the invention might be embodied or operated.

The invention has been described in considerable detail in order to comply with the patent laws by providing full public disclosure of at least one of its forms. However, such detailed description is not intended in any way to limit the broad features or principles of the invention, or the scope of patent monopoly to be granted.

What is claimed is:

1. A circuit board guide and interfitting device, comprising:
    a. a block having a generally rectangular body including a top, a bottom, a first sidewall, a second sidewall, a rear and a front;
    b. said first sidewall including a lower channel which extends into the body and a generally parallel and spaced apart upper channel which extends into the body;
    c. said second sidewall including a lower channel which extends into the body and a generally parallel and spaced apart upper channel which extends into the body;
    d. the lower channel in the first sidewall aligned with and parallel to the lower channel in the second sidewall and the upper channel in the first sidewall aligned with parallel to the upper channel in the second sidewall;
    e. the lower channel and the upper channel in the first sidewall separated by a predetermined distance and the lower channel and the upper channel in the second sidewall separated by the same distance;
    f. a fixed stop means located adjacent the rear and extending transversely from the first sidewall to the second sidewall and through both lower channels;
    g. a movable stop means spaced apart from said fixed stop means and extending transversely from the first sidewall to the second sidewall through a transverse opening in the block and further extending through both lower channels;
    h. a first printed circuit board;
    i. a second printed circuit board including a connecting member;

j. a mounting board; and k. means for attaching said block to said mounting board;

l. whereby a pair of said blocks are attached at spaced apart locations on said mounting board such that after said movable stop means of each block is moved away from the lower channel of the second sidewall and the corresponding parallel lower channel of the first sidewall of the respective blocks, the oppositely disposed edges of a first printed circuit board is slid into the corresponding lower channels and the movable stop means thereafter replaced thereby retaining the edges of the first printed circuit board in the two lower channels between the fixed stop means and the movable stop means of each block, the first printed circuit board further including a connecting member on an edge adjacent the front of the blocks which connecting member is aligned with the respective upper channel of the second sidewall and the upper channel of the first sidewall of the blocks such that the edges of the second printed circuit board are slid into the two upper channels such that the connecting member of the second printed circuit board is engaged into the connecting member of the first printed circuit board.

2. A circuit board guide and interfitting device in accordance with claim 1, further comprising a generally V-shaped groove in the front which corresponds with the upper channels to thereby facilitate the insertion of the second printed circuit board into corresponding upper grooves in the two spaced apart blocks.

3. A circuit board guide and interfitting device, comprising:

a. a block having a generally rectangular body including a top, a bottom, a first sidewall, a second sidewall, a rear and a front;

b. a pair of generally parallel spaced apart channel means in said first sidewall and a second pair of parallel spaced apart channel means in said second sidewall with each channel means configured to receive an edge of a printed circuit board;

c. one of each pair of channels in each sidewall aligned with a corresponding channel; in the other sidewall;

d. a first printed circuit board including connecting means;

e. a second printed circuit board including connecting means;

f. a mounting board; and g. means for attaching said block to said mounting board;

h. whereby a pair of spaced apart blocks are attached to said mounting board such that oppositely disposed edges of said first printed circuit board are received and retained in corresponding oppositely disposed channels and oppositely disposed edges of said second printed circuit board are received and retained in the second two corresponding oppositely disposed channels in the same sidewalls of the blocks and the pair of spaced apart channels in each sidewall are separated by a predetermined distance permitting the two printed circuit boards to be interconnected by the respective connecting means in the two printed circuit boards.

4. A circuit board guide and interfitting device in accordance with claim 3 further comprising stop means for retaining an edge of a printed circuit board in said first fixed position within one of the channels in each sidewall.

5. A circuit board guide and interfitting device in accordance with claim 4 further comprising means for facilitating entry of an edge of said second printed circuit board in the other of the channels in each sidewall.

6. A system for testing computer drives, comprising:

a. a pair of circuit board guide and interfitting devices, each circuit board guide and interfitting device further comprising, (i) a block having a generally rectangular body including a top, a bottom, a first sidewall, a second sidewall, a rear and a front;

(ii) said first sidewall including a lower channel which extends into the body and a generally parallel and spaced apart upper channel which extends into the body;

(iii) said second sidewall including a lower channel which extends into the body and a generally parallel and spaced apart upper channel which extends into the body;

(iv) the lower channel in the first sidewall aligned with and parallel to the lower channel in the second sidewall and the upper channel in the first sidewall aligned with parallel to the upper channel in the second sidewall;

(v) the lower channel and the upper channel in the first sidewall separated by a predetermined distance and the lower channel and the upper channel in the second sidewall separated by the same distance;

(vi) a fixed stop means located adjacent the rear and extending transversely from the first sidewall to the second sidewall and through both lower channels;

(vii) a movable stop means spaced apart from said fixed stop means and extending transversely from the first sidewall to the second sidewall through a transverse opening in the block and further extending through both lower channels;

(viii) means for attaching said block to a mounting board;

b. a test printed circuit board having oppositely disposed side edges and a connecting member along its front edge;

c. an interface printed circuit board having oppositely disposed side edges and a connecting member along its rear edge and a pair of spaced apart edge connectors affixed along its front edge;

d. a mounting board; and e. a computer drive having a pair of spaced apart connectors spaced apart to correspond to the pair of edge connectors;

f. whereby the blocks of said pair of circuit board guide and interfitting devices, are attached at spaced apart locations on said mounting board such that after said movable stop means of each block is moved away from the lower channel of the second sidewall and the corresponding parallel lower channel of the first sidewall of the respective blocks, the oppositely disposed edges of the test printed circuit board are slid into the corresponding lower channels and the movable stop means thereafter replaced thereby retaining the edges of the test printed circuit board in the two lower channels between the fixed stop means and the movable stop means of each block, the connecting member of the test printed circuit board resting adjacent the front of the blocks and the connecting member aligned with the respective upper channel of the second sidewall and the upper channel of the first sidewall of the blocks such that the edges of the interface printed circuit board are slid into the two upper channels such that the connecting member of the interface printed circuit board is engaged into the connecting member of the test printed circuit board and the two edge connectors of the interface printed circuit board are aligned to receive the connectors of the computer drive.

7. A system for testing computer drives, comprising:
a. a pair of circuit board guide and interfitting devices, each circuit board guide and interfitting device further comprising,
   (i) a block having a generally rectangular body including a top, a bottom, a first sidewall, a second sidewall, a rear and a front;
   (ii) a pair of generally parallel spaced apart channel means in said first sidewall and a second pair of parallel spaced apart channel means in said second sidewall with each channel means configured to receive an edge of a printed circuit board;
   (iii) one of each pair of channel means in each sidewall aligned with a corresponding channel means;
   (iv) means for attaching said block to a mounting board;
b. a test printed circuit board having oppositely disposed side edges and connecting means along its front edge;
c. an interface printed circuit board having oppositely disposed side edges and connecting means along its rear edge and a pair of spaced apart edge connectors affixed along its front edge;
d. a mounting board; and
e. a computer drive having a pair of spaced apart connectors spaced apart to correspond to the pair of edge connectors;
f. whereby the blocks of said pair of circuit board guide and interfitting devices are attached at spaced apart locations on said mounting board such that the oppositely disposed side edges of the test printed circuit board are received and retained in corresponding oppositely disposed channel means and the oppositely disposed side edges of the interface printed circuit board are received and retained in the second two corresponding oppositely disposed channel means in the same sidewalls of the blocks and the pair of spaced apart channel means in each sidewall are separated by a predetermined distance permitting the connecting means of the test printed circuit board and the interface printed circuit board to be interconnected and the two edge connectors of the interface printed circuit board are aligned to receive the connectors of the computer drive.

* * * * *